United States Patent
Cheng et al.

(10) Patent No.: US 8,070,313 B2
(45) Date of Patent: Dec. 6, 2011

(54) BACKLIGHT STRUCTURE INCLUDING CLIPPING CONNECTORS

(75) Inventors: Chuan-Ho Cheng, Hsinchu (TW);
Chih-Kang Wu, Hsinchu (TW);
Kuo-Cheng Huang, Hsinchu (TW);
Shih-Che Fu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/893,373

(22) Filed: Sep. 29, 2010

(65) Prior Publication Data
US 2011/0013380 A1 Jan. 20, 2011

Related U.S. Application Data

(62) Division of application No. 11/971,237, filed on Jan. 9, 2008, now Pat. No. 7,824,072.

(30) Foreign Application Priority Data

Sep. 12, 2007 (TW) .............................. 96134012 A

(51) Int. Cl.
*H01R 33/02* (2006.01)
*G09F 13/04* (2006.01)

(52) U.S. Cl. .................. 362/217.17; 362/97.2; 362/658; 362/249.01; 439/46; 439/239

(58) Field of Classification Search .......... 362/97.2, 362/217.17, 657, 658, 249.01; 439/46, 226, 439/239, 238; 493/226, 239, 238

See application file for complete search history.

(56) References Cited

U.S. PATENT DOCUMENTS

| 1,293,594 A | | 2/1919 | Willey | |
|---|---|---|---|---|
| 2,296,114 A | | 9/1942 | Mueller | |
| 2,565,064 A | | 8/1951 | Carlson | |
| 2,742,627 A | | 4/1956 | Mackey et al. | |
| 2,744,214 A | * | 5/1956 | Di Marco et al. | 361/815 |
| 2,766,435 A | * | 10/1956 | French | 439/263 |
| 2,790,961 A | * | 4/1957 | Del Camp | 439/554 |
| 2,794,962 A | * | 6/1957 | Donato | 439/554 |
| 2,831,282 A | * | 4/1958 | Hardesty | 40/546 |
| 2,957,157 A | | 10/1960 | Carter | |
| 2,984,768 A | * | 5/1961 | Henry | 361/760 |
| 3,005,907 A | * | 10/1961 | Dupree | 362/630 |
| 3,029,365 A | * | 4/1962 | Plesser | 361/752 |
| 3,038,139 A | | 6/1962 | Bonanno | |
| 3,333,228 A | | 7/1967 | Ege | |

(Continued)

FOREIGN PATENT DOCUMENTS

EP 2 045 519 8/2009

(Continued)

OTHER PUBLICATIONS

Taiwanese language office action dated Jul. 11, 2011.

(Continued)

*Primary Examiner* — Ismael Negron
(74) *Attorney, Agent, or Firm* — Thomas, Kayden, Horstemeyer & Risley, LLP

(57) ABSTRACT

A backlight structure comprises a frame, a circuit board, and a connector. The frame has an opening. The circuit board is located below the frame and has a through hole, wherein the through hole aligns with the opening. The connector passes through the opening and the through hole, protrudes from a surface of the frame, and is electrically connected to the circuit board.

4 Claims, 15 Drawing Sheets

U.S. PATENT DOCUMENTS

| | | | |
|---|---|---|---|
| 3,344,388 A | 9/1967 | Parker et al. | |
| 4,130,860 A | 12/1978 | Careglio et al. | |
| 4,918,582 A | 4/1990 | McIngvale et al. | |
| 4,928,210 A | 5/1990 | Hayakawa et al. | |
| 4,938,708 A * | 7/1990 | Vigneau et al. | 439/239 |
| 4,993,965 A | 2/1991 | Eck | |
| 5,169,331 A | 12/1992 | Caldwell et al. | |
| 5,430,615 A | 7/1995 | Keeth et al. | |
| 5,484,965 A | 1/1996 | Woychik | |
| 5,615,944 A * | 4/1997 | Siegfried et al. | 362/548 |
| 5,720,546 A * | 2/1998 | Correll et al. | 362/221 |
| 7,086,775 B2 | 8/2006 | Huang et al. | |
| 7,549,881 B2 | 6/2009 | Cho et al. | |
| 2003/0179577 A1 | 9/2003 | Marsh | |
| 2005/0181637 A1 | 8/2005 | Williams et al. | |
| 2006/0128174 A1 | 6/2006 | Jang et al. | |
| 2006/0250821 A1 | 11/2006 | Kang et al. | |
| 2006/0279957 A1 | 12/2006 | Kwon et al. | |
| 2007/0037427 A1 | 2/2007 | Miyazono | |
| 2008/0002392 A1 * | 1/2008 | Kim | 362/97 |
| 2008/0106900 A1 | 5/2008 | Chang et al. | |
| 2008/0124950 A1 | 5/2008 | Yuan et al. | |
| 2009/0046462 A1 | 2/2009 | Park et al. | |
| 2009/0128734 A1 * | 5/2009 | Cho et al. | 349/61 |
| 2009/0190060 A1 | 7/2009 | Choi | |

FOREIGN PATENT DOCUMENTS

| | | |
|---|---|---|
| TW | M310512 | 10/1995 |
| TW | M316532 | 12/1995 |
| WO | WO 2007/041128 | 4/2007 |
| WO | WO 2008/001566 | 1/2008 |

OTHER PUBLICATIONS

English language translation of abstract of TW M310512. 1994.
English language translation of abstract of TW M316532. 1995.

* cited by examiner

BACKLIGHT STRUCTURE INCLUDING CLIPPING CONNECTORS

CROSS-REFERENCES TO RELATED APPLICATIONS

This application is a divisional of pending U.S. application Ser. No. 11/971,237 filed Jan. 9, 2008 (now U.S. Pat. No. 7,824,072), which claims priority to Taiwan Patent Application No. 096134012 filed on Sep. 12, 2007, the disclosure of which is incorporated herein by reference. Also, the subject matter of this application is generally related to the subject matter of U.S. patent application Ser. No. 12/145,028, filed Jun. 24, 2008.

BACKGROUND OF THE INVENTION

1. Field of the Invention

The invention relates to a backlight structure, and more particularly, to a backlight structure having an assembly of a connector and an electrically conductive element, or an assembly of a first electrically conductive element and a second electrically conductive element.

2. Description of the Related Art

Referring to FIG. 1, a schematic view of a conventional backlight structure, FIG. 2, an A-A sectional view of FIG. 1, and FIG. 3, an exploded view of a tubular lamp and a fixture of the conventional backlight structure, the conventional backlight structure 20 comprises a frame 201, a circuit board 202, a fixture 203, a supporting seat 204 and a male connector 205, described in detail in the following.

The frame 201 has a through hole 210. The circuit board 202 is disposed below the frame 201 and has a female connector 206. The fixture 203 has a passageway 211 for a power wire, a cavity 212 and at least a notch 213, wherein the passageway 211 for a power wire connects with the cavity 212 and the notch 213 is disposed on an edge of the fixture 203. The male connector 205 has a power wire 208 and is connected to the female connector 206 of the circuit board 202. A tubular lamp 207 is disposed in the cavity 202 of the fixture 203.

An assembly process of the conventional backlight structure is described in detail in the following.

The fixture 203 is squeezed into the through hole 210 of the frame 201 and fixed to the frame 201 via the notch 213. The power wire 208 of the male connector 205 of the circuit board 202 is passed through the passageway 211 of the fixture 203 and protrudes from the cavity 212. The power wire 208 is welded to the tubular lamp 207 to electrically connect to the tubular lamp 207. Then, the tubular lamp 207 is put in the cavity 212.

Then the male connector 205 is electrically connected to the female connector 206 to thereby finish the electrical connection between the tubular lamp 207 and the circuit board 202.

Then, the circuit board 202 is fixed to the frame 201 by a screw 209 which is passed through the supporting seat 204 disposed between the circuit board 202 and the frame 201 to finish the assembly process of the conventional backlight structure.

For the conventional backlight structure, however, assembly and disassembly of the circuit board, frame, and the tubular lamp are complicated and requires manual welding. Thus, problems associated with costs, labor and assembly are prevalent and efficiency of the assembly and manufacturing process is hampered.

BRIEF SUMMARY OF THE INVENTION

The invention provides a backlight structure, which is conveniently assembled and disassembled, to simplify the assembly process, reduce costs and effectively raise manufacturing efficiency.

The invention provides a backlight structure comprising a frame, a circuit board and a connector. The frame has an opening. The circuit board has a through hole aligning with the opening. The connector passes through the opening and the through hole, and protrudes from a surface of the frame.

The invention provides another backlight structure comprising an insulator, a frame, a circuit board, a first electrically conductive element and a second electrically conductive element. The insulator element has a first opening. The frame has a second opening. The circuit board has a through hole aligning with the first opening and the second opening. The first electrically conductive element passes through the first opening and the second opening, and protrudes from a surface of the insulator. The second electrically conductive element passes through the first opening, the second opening and the through hole, and electrically connects to the first electrically conductive element.

In the backlight structure of the invention, the connector or the assembly, combining the first electrically conductive element and the second electrically conductive element, is used to simplify the complicated assembly process of conventional methods by replacing the welding technique of conventional methods with the electrical connections of the invention. Thus, the problems associated with disassembly, assembly, welding, labor and costs are improved, and the efficiency of the assembly and manufacturing process is raised.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
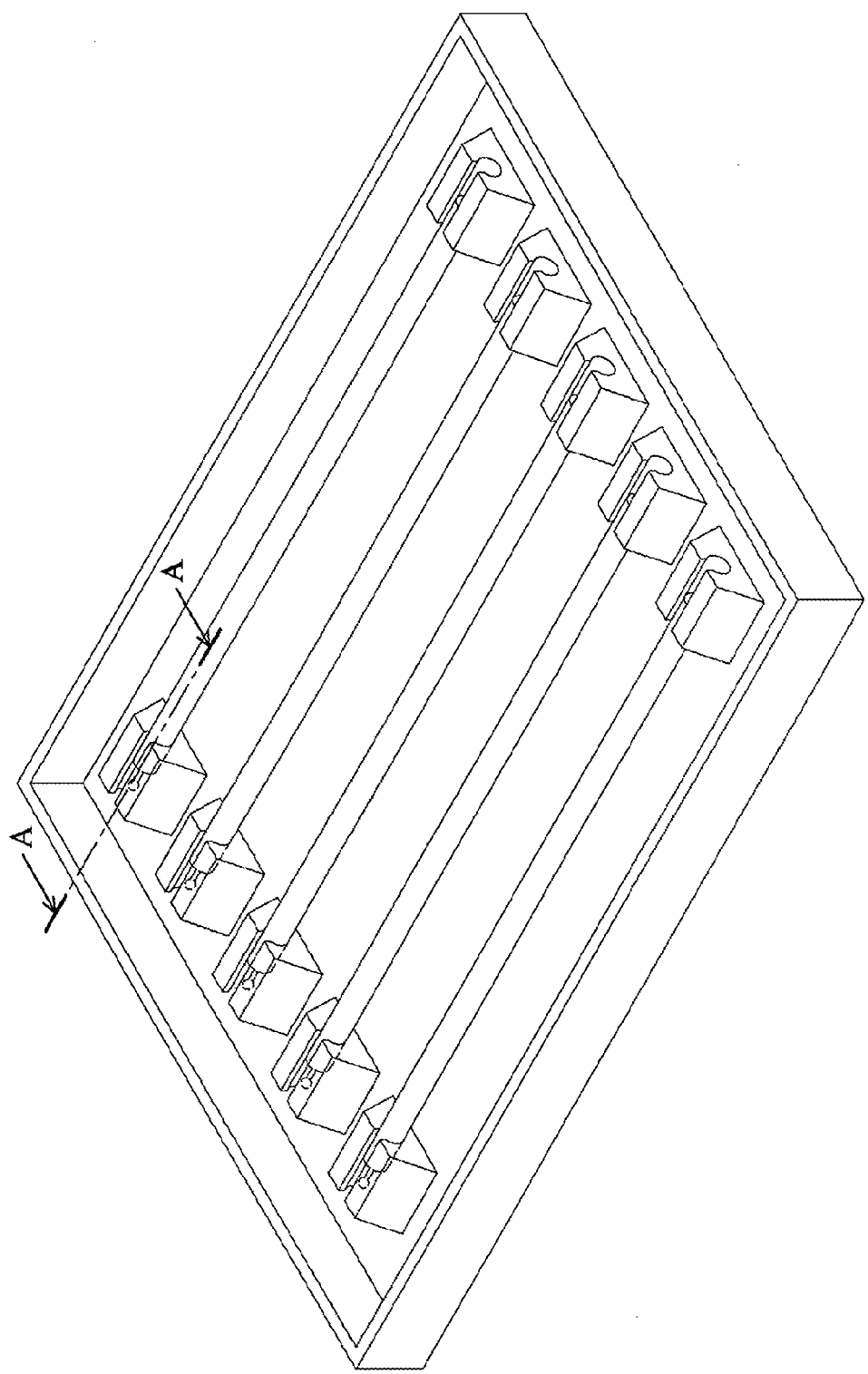
FIG. 1 is a schematic view of a conventional backlight structure.
Figure 2:
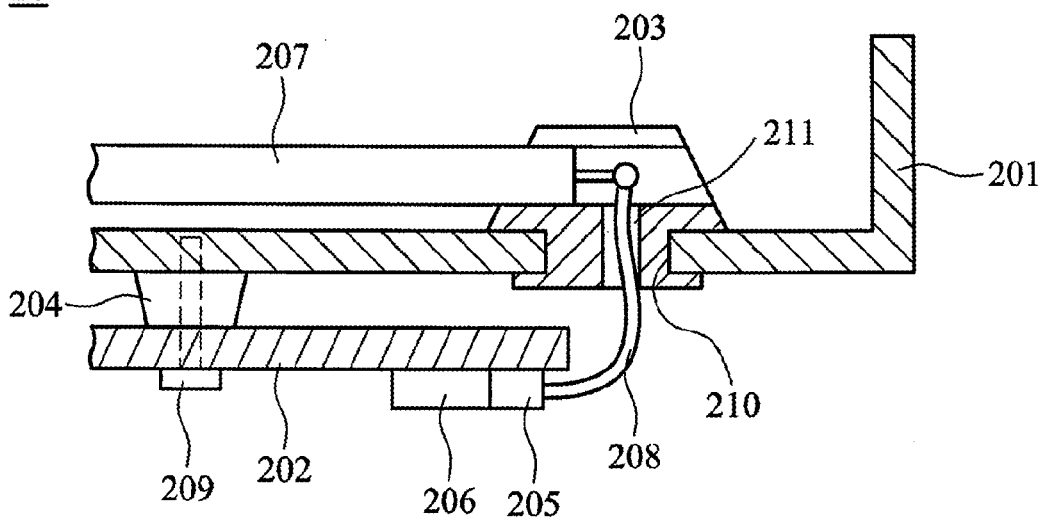
FIG. 2 is an A-A sectional view of the conventional backlight structure.
Figure 3:
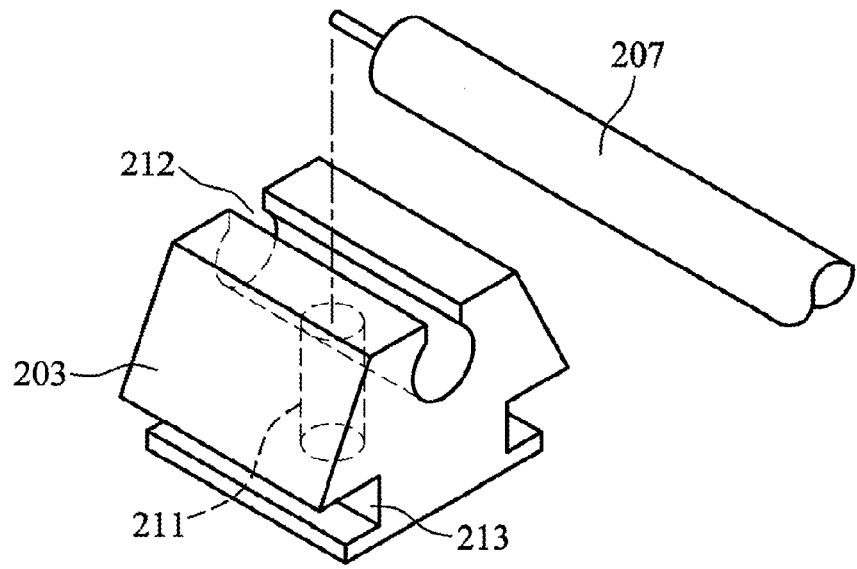
FIG. 3 is an exploded view of a tubular lamp and a fixture of the conventional backlight structure.
Figure 4:
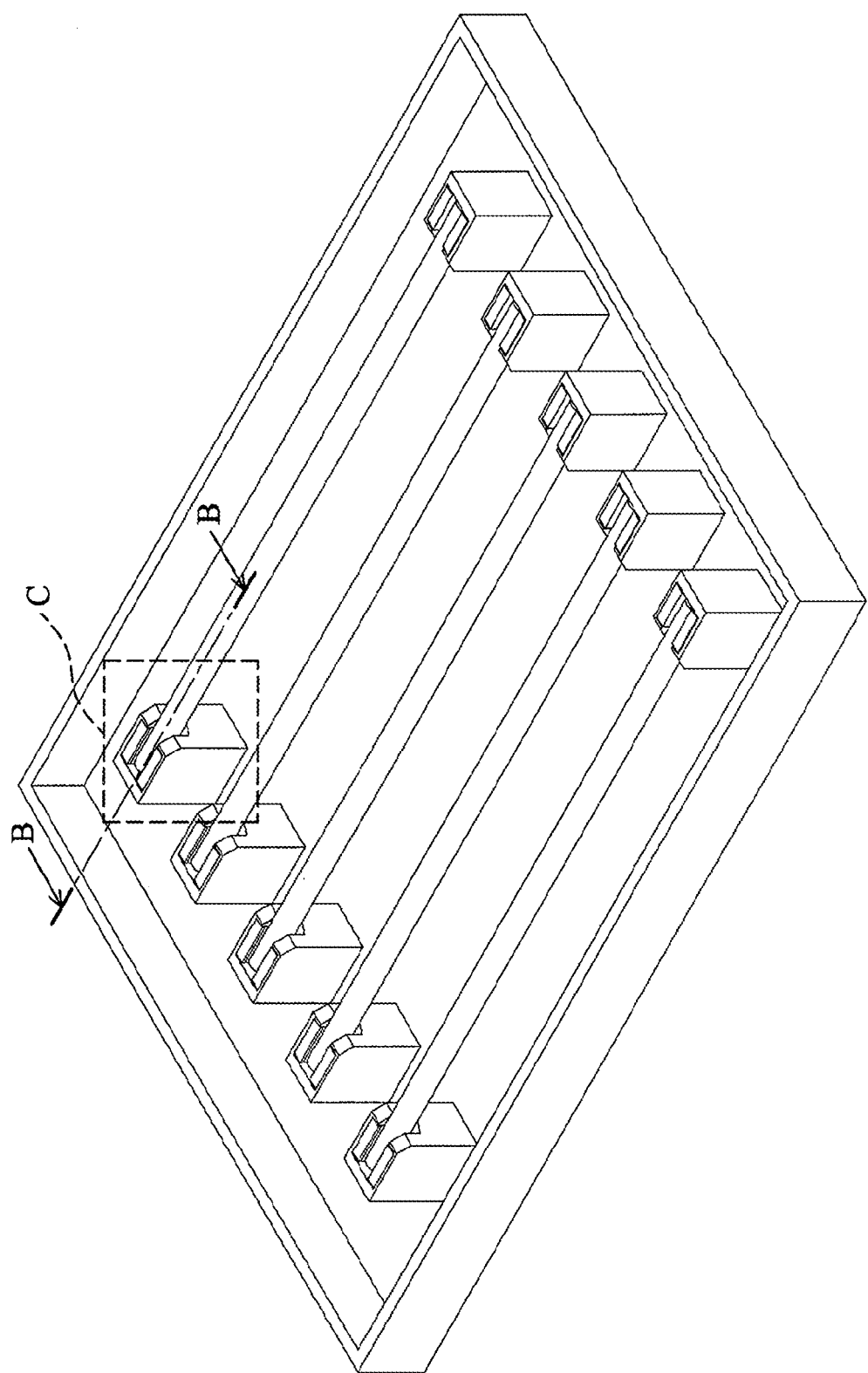
FIG. 4 is a schematic view of a first embodiment of the invention.
Figure 5:
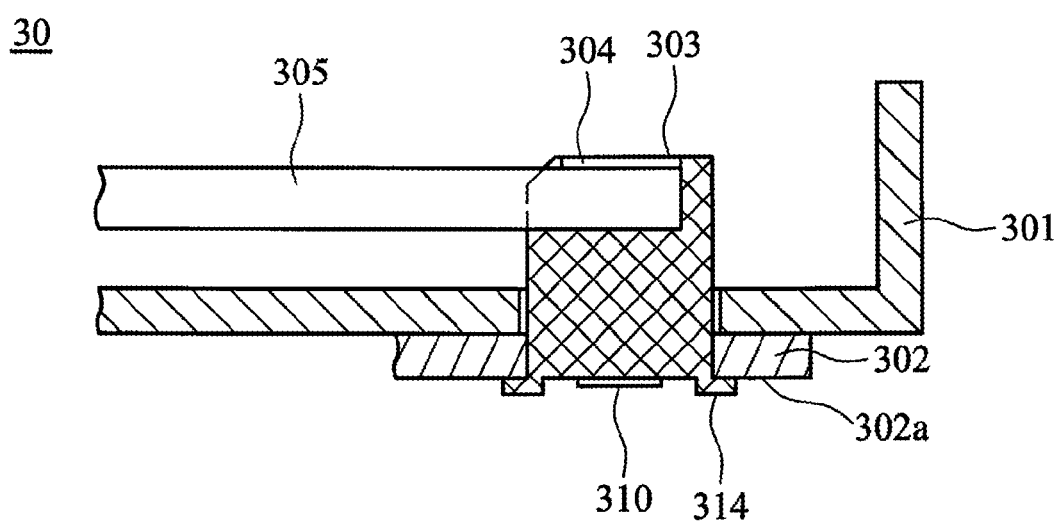
FIG. 5 is a B-B sectional view of the first embodiment of the invention.
Figure 6:
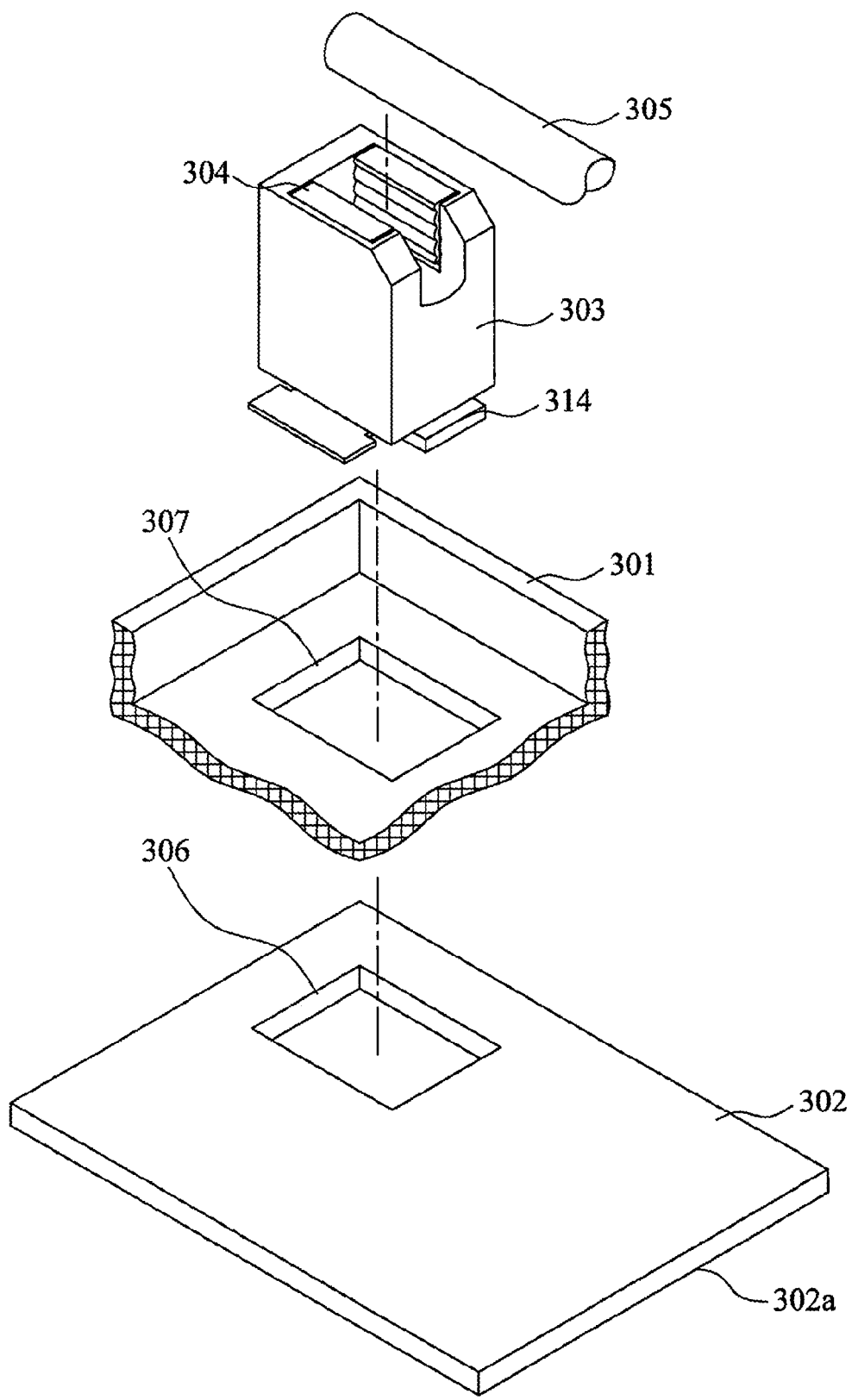
FIG. 6 is an exploded view of the first embodiment of the invention.

Referring to FIG. 4, a schematic view of a first embodiment of the invention, FIG. 5, a B-B sectional view of the first embodiment of the invention, and FIG. 6, an exploded view of the first embodiment of the invention, the backlight structure 30 of the first embodiment comprises a frame 301, a circuit board 302, and a connector 303. The frame 301 has an opening 307. The circuit board 302 is located below the frame 301 and has a through hole 306 which aligns with the opening 307. The connector 303 passes through the through hole 306 and the opening 307, and protrudes from a surface of the frame 301. In the first embodiment of the invention, the connector 303 may be plastic. The connector 303 has an electrically conductive element 304 and at least one leg 314, and the electrically conductive element 304 is located in the connector 303, protrudes from a bottom of the connector 303 and is electrically connected to the circuit board 302. The leg 314 extends from the bottom of the connector 303 and contacts a bottom 302a of the circuit board 302.

Figure 7:
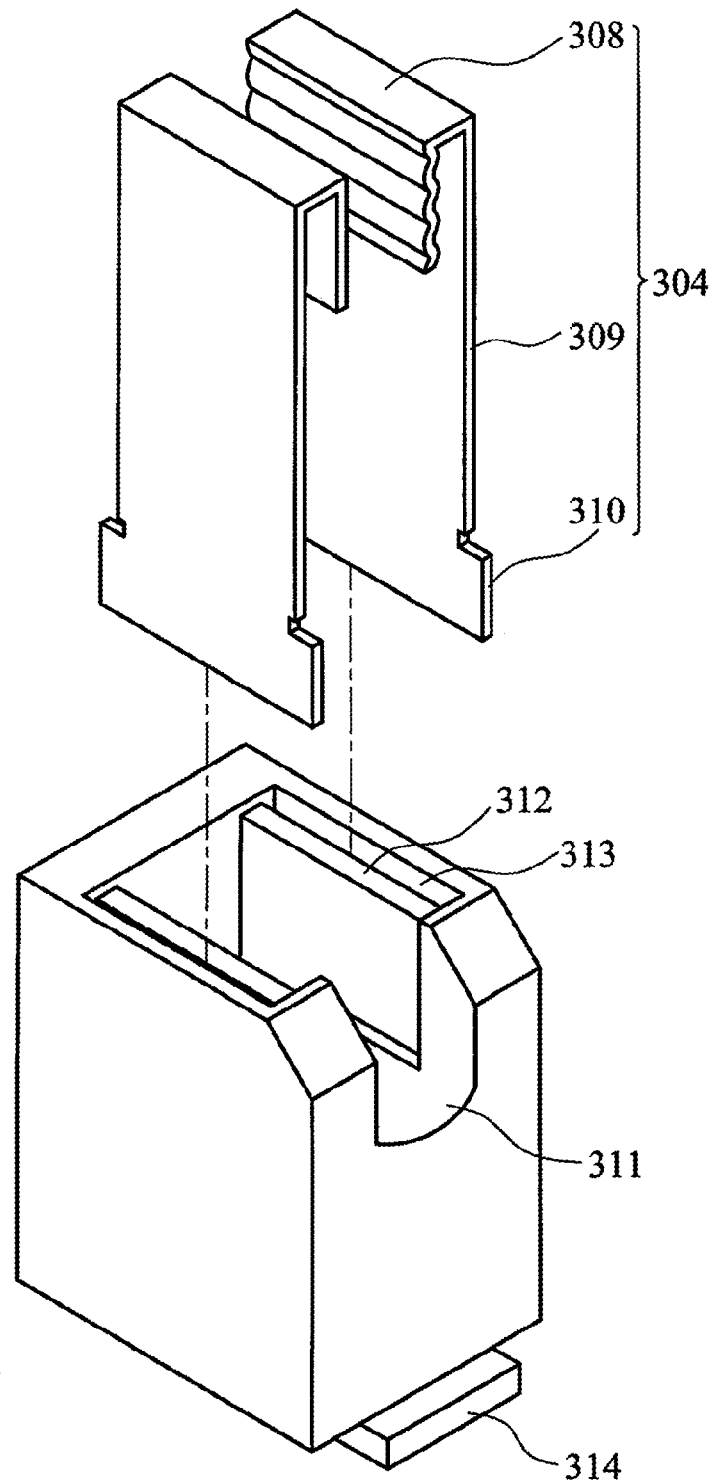
FIG. 7 is an exploded view of a connector of the first embodiment of the invention.
Figure 8:
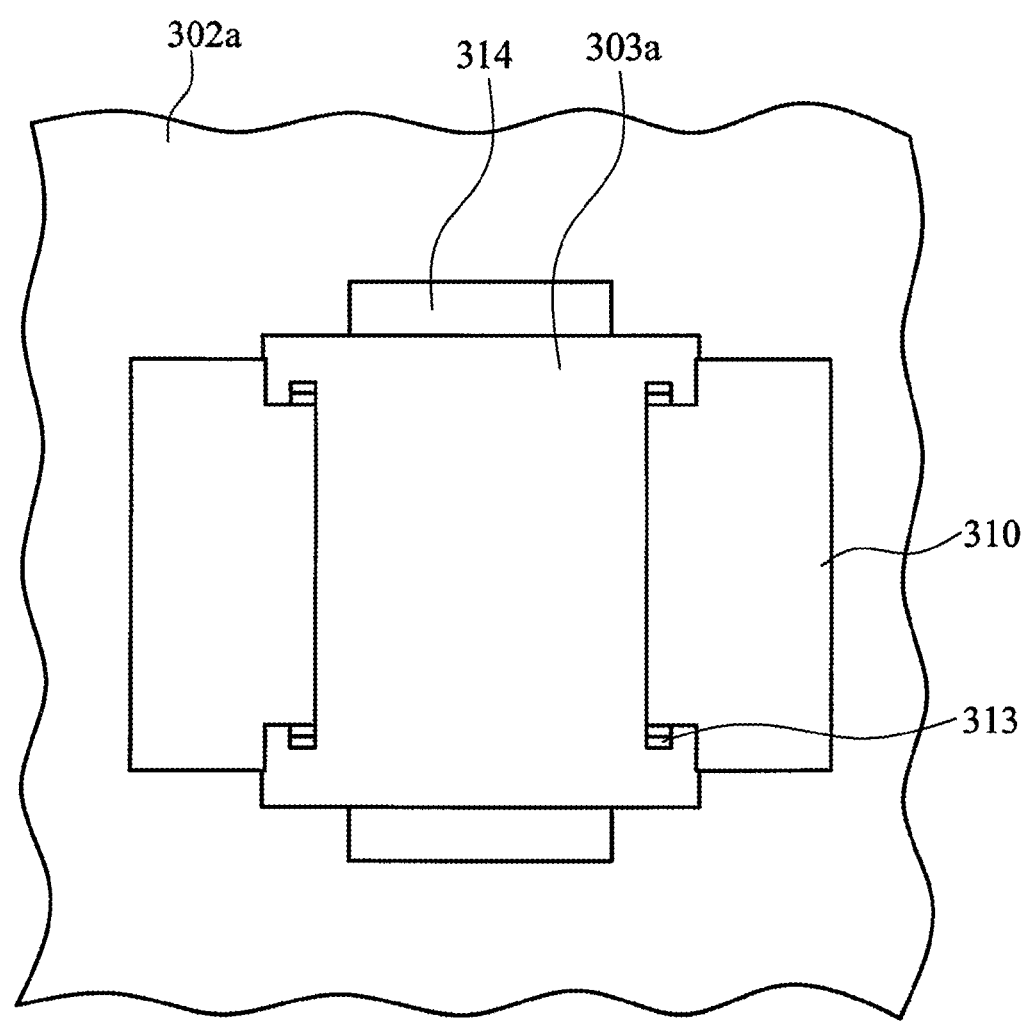
FIG. 8 is a schematic view of a bottom of the backlight structure of the first embodiment of the invention.

Referring to FIG. 7, an exploded view of a connector of the first embodiment of the invention, and FIG. 8, a schematic view of a bottom of the backlight structure of the first embodiment of the invention, the connector 303 has a cavity 311, a positioning wall 312 and at least a gap 313. The cavity 311 is located at a top of the connector 303, the positioning wall 312 and the gap 313 are disposed adjacent to the cavity 311, and the positioning wall 312 is disposed between the gap 313 and the cavity 311. The electrically conductive element 304 of the connector 303 has a clipping part 308 located at a top of the electrically conductive element 304, a through part 309 and a backstay 310 located at an end of the electrically conductive element 304. When finishing the assembly, the clipping part 308 contacts the positioning wall 312, the backstay 310 protrudes from the bottom 303a of the connector 303, and the backstay 310 is bent to contact the bottom 302a of the circuit board 302. Thus, the bent backstay 310 is inclined to the leg 314 at a right angle. The through part 309 connects the clipping part 308 and the backstay 310, and is located in the gap 313 when finishing the assembly. In the first embodiment of the invention, the clipping part 308 is wavy to increase clipping capability. For design of the clipping part 308, however, the shape may vary dependent upon requirements (e.g. arched).

The assembly process of the backlight structure 30 of the invention is described in detail in the following. The backstay 310 and the through part 309 of the electrically conductive element 304 are passed through the gap 313 of the connector 303. The through part 309 is located in the gap 313, the backstay 310 passes through the gap 313 and protrudes from the bottom 303a of the connector 303, and the clipping part 308 of the electrically conductive element 304 clips and contacts the positioning wall 312 to fix the electrically conductive element 304 on the connector 303.

The assembly of the connector 30 and the electrically conductive element 304 is then passed through the opening 307 of the frame 301 and the through hole 306 of the circuit board 302 in sequence, and the leg 314 extending from the bottom 303a of the connector 303 contacts the circuit board 302. Then, the backstay 310 of the electrically conductive element 304 is bent to contact the bottom 302a of the circuit board 302, and is tightly attached to the bottom 302a of the circuit board 302 by SMT (Surface Mount Technology). Thus, the electrically conductive element 304 is fixed and electrically connected to the circuit board 302.

Then, the tubular lamp 305 is put in the cavity 311 of the connector 303 and clipped by the clipping part 308 of the electrically conductive element 304 to electrically connect to the circuit board 302, thereby finishing the assembly process of the backlight structure of the invention.

For the above description, the assembly, combining the connector and the electrically conductive element, is used to simplify the complicated assembly process of the conventional methods by replacing the welding technique of conventional methods with the electrical connections of the invention. Thus, the problems associated with disassembly, assembly, welding, labor and costs are improved, and the efficiency of the assembly and manufacturing process is raised.

Figure 9:
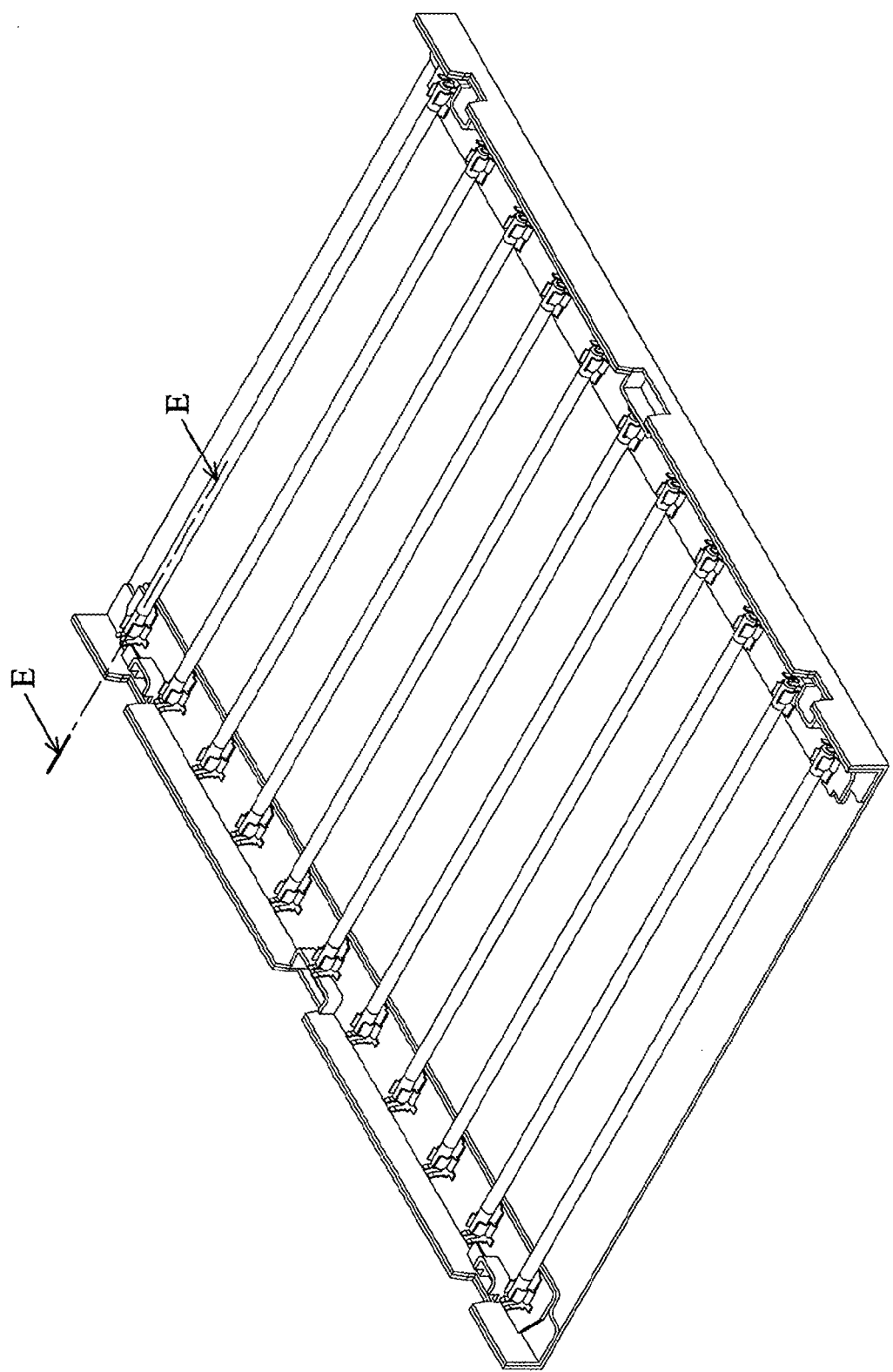
FIG. 9 is a schematic view of a second embodiment of the invention.
Figure 10:
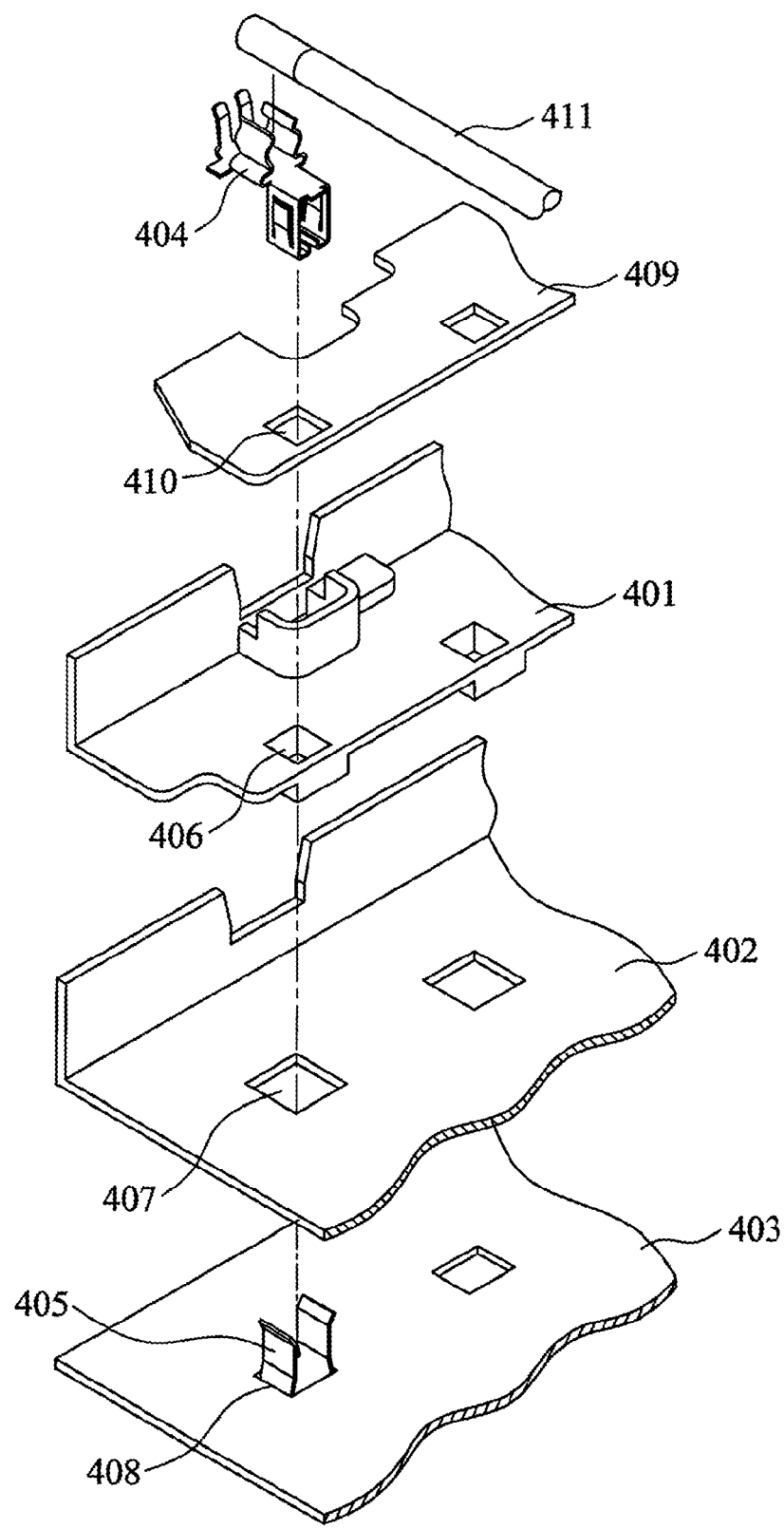
FIG. 10 is an exploded view of the second embodiment of the invention.

Referring to FIG. 9, a schematic view of a second embodiment of the invention, and FIG. 10, an exploded view of an E-E sectional view of the second embodiment of the invention, the backlight structure 40 of the second embodiment comprises an insulator element 401, a frame 402, a first circuit board 403, a second circuit board 409, a first electrically conductive element 404 and a second electrically conductive element 405, described in detail in the following. The insulator element 401 has a first opening 406. The frame 402 is located below the insulator 401 and has a second opening 407. The first circuit board 403 is located below the frame 402 and has a first through hole 408. The second circuit board 409 is disposed above the insulator 401 and has a second through hole 410. The first through hole 408 aligns with the first opening 406 and the second opening 407. The first electrically conductive element 404 passes upward through the second through hole 410, the first opening 406 and the second opening 407, protrudes from surfaces of the insulator 401 and the second circuit board 409, and clips the tubular lamp 411 to electrically connect to the tubular lamp 411. The second electrically conductive element 405 passes downward through the first through hole 408 of the first circuit board 403, the second opening 407 of the frame 402 and the first opening 406 of the insulator 401, and is electrically connected to the first electrically conductive element 404. The backstay 420, extending from a bottom 421 (as shown in FIG. 11) of the second electrically conductive element 405, contacts a bottom 403a of the first circuit board 403.

Figure 11:
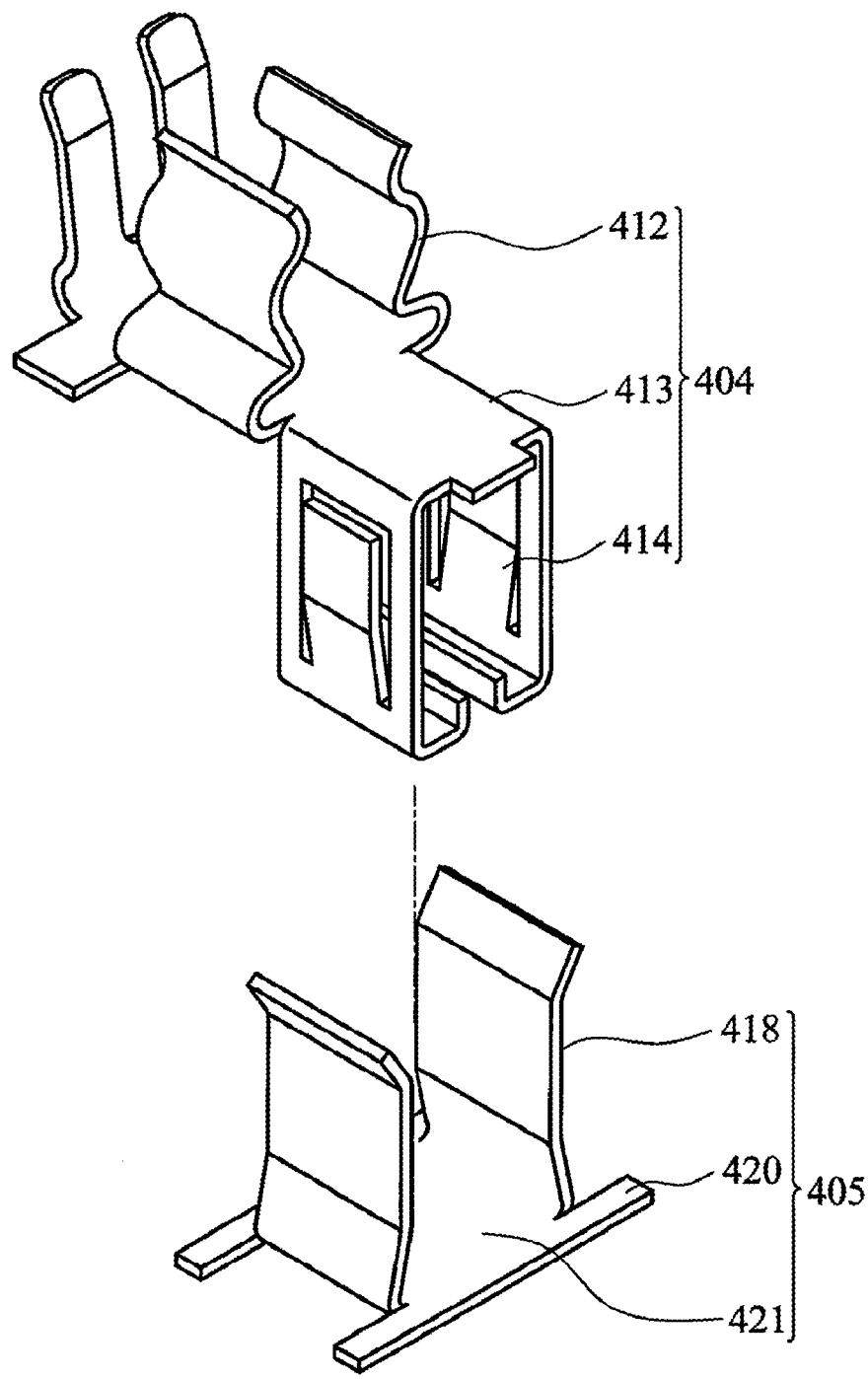
FIG. 11 is an exploded view of a first electrically conductive element and a second electrically conductive element of the second embodiment of the invention.
Figure 12:
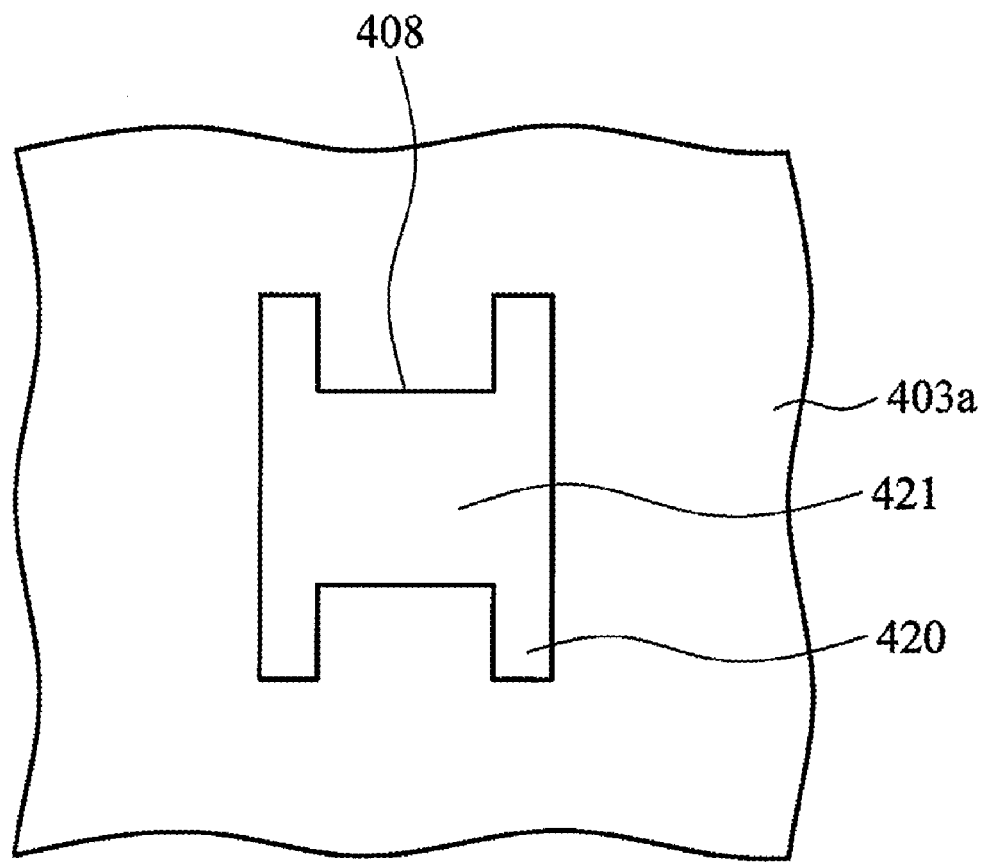
FIG. 12 is a schematic view of a bottom of the backlight structure of the second embodiment of the invention.
Figure 13:
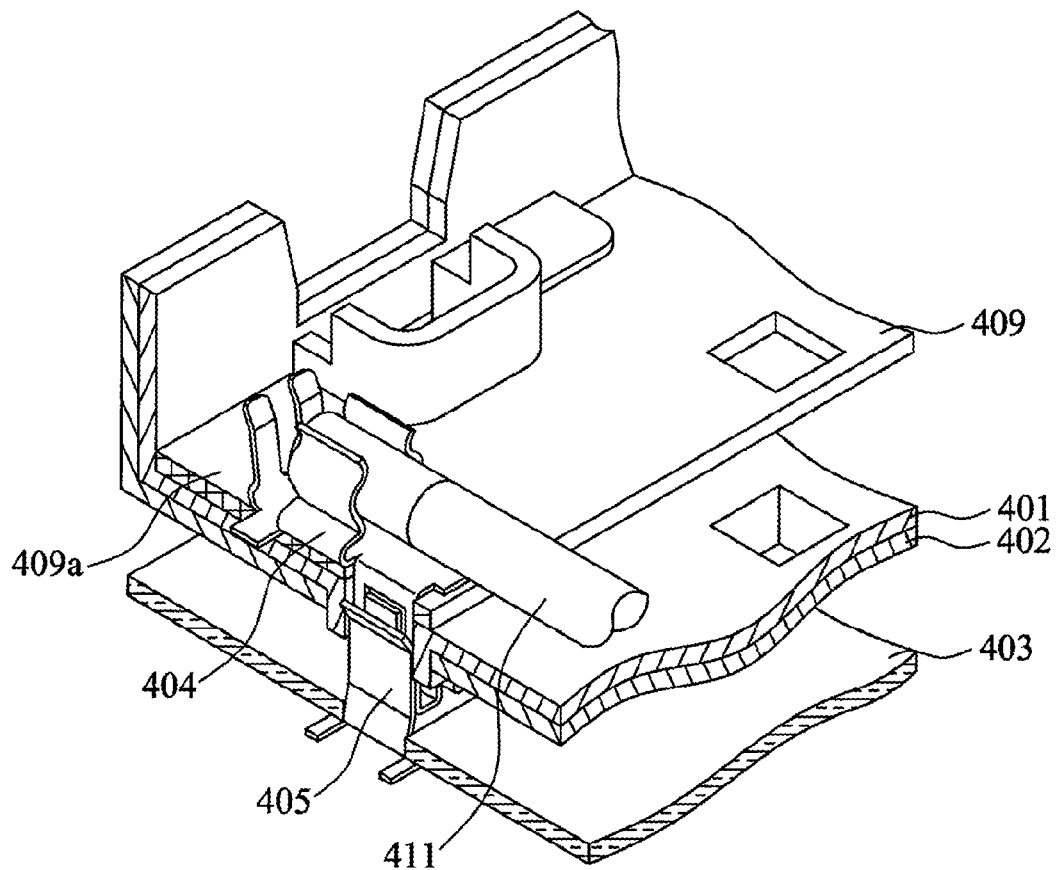
FIG. 13 is an assembly drawing of the backlight structure of the second embodiment of the invention.

Referring to FIG. 11, an exploded view of a first electrically conductive element and a second electrically conductive element of the second embodiment of the invention, and FIG. 12, a schematic view of a bottom of the backlight structure of the second embodiment of the invention, the first electrically conductive element 404 has a first clipping part 412, a supporting part 413 and a first clipped part 414. The first clipping part 412 is located above the supporting part 413. The first clipped part 414 is located adjacent to the supporting part 413. The second electrically conductive element 405 has a second clipped clipping part 418 extending upward from the bottom 421. When the first electrically conductive element 404 and the second electrically conductive element 405 are combined, the second clipping part 418 clips the first clipped part 414. In the second embodiment, the second electrically conductive element 405 clips the first electrically conductive element 404, and the first clipped part 414 protrudes from outsides of the supporting part 413 to increase the combined capacity of the first electrically conductive element 404 and the second electrically conductive element 405. However, the first electrically conductive element 404 can be modified to clip the second electrically conductive element 405, wherein the first clipped part 414 protrudes inward from the supporting part 413. The tubular lamp 411 (as shown in FIG. 13) is put in the first clipping part. When the second electrically conductive element 405 passes upward through the first through hole 408 of the first circuit board 403, the backstay 420, extending form a bottom 421, contacts the bottom 403a of the first circuit board 403.

The assembly process of the backlight structure 40 of the invention is described in detail in the following. The second electrically conductive element 405 is passed upward through the first through hole 408 of the first circuit board 403, and the backstay 420 contacts the bottom 403a of the first circuit board 403, and then the backstay 420 is bounded to the bottom 403a of the first circuit board 403 by surface mount technology (SMT). Thus, the second electrically conductive element 405 is fixed and electrically connected to the first circuit board 403.

The first clipped part 414 of the first electrically conductive element 404 is then passed downward through the second through hole 410 of the second circuit board 409, and the first electrically conductive element 404 is bounded to a surface 409a of the second circuit board 409 by surface mount technology (SMT), wherein the first clipped clipping part 412 and the supporting part 413 of the first electrically conductive element 404 are exposed above the second circuit board 409. The first clipped part 414 of the first electrically conductive element 404 passes through the first opening 406 of the insulator 401 and the second opening 407 of the frame 402 in sequence.

The second clipping part 418 of the second electrically conductive element 405 then clips the first clipped part 414 of the first electrically conductive element 404. Thus, the first electrically conductive element 404 is fixed in the second electrically conductive element 405 and electrically connected thereto.

The tubular lamp 411 is then put in the first electrically conductive element 404 and clipped by the first clipping part 412. Thus, tubular lamp 411 is electrically connected to the first circuit board 403 through the first electrically conductive element 404 to finish the assembly process of the backlight structure of the invention (as shown in FIG. 13).

Practically, the second circuit board 409 may be provided with circuits thereon. Alternatively, the second circuit board 409 is without circuits thereon, made of plastic or polymeric methyl methacrylate (PMMA), and only used for connecting to the first electrically conductive element 404. Furthermore, the second circuit board 409 can be omitted, and the first electrically conductive element 404 can be directly formed on the insulator 401 by injection-molding to further simplify the assembly process and reduce costs.

Figure 14:
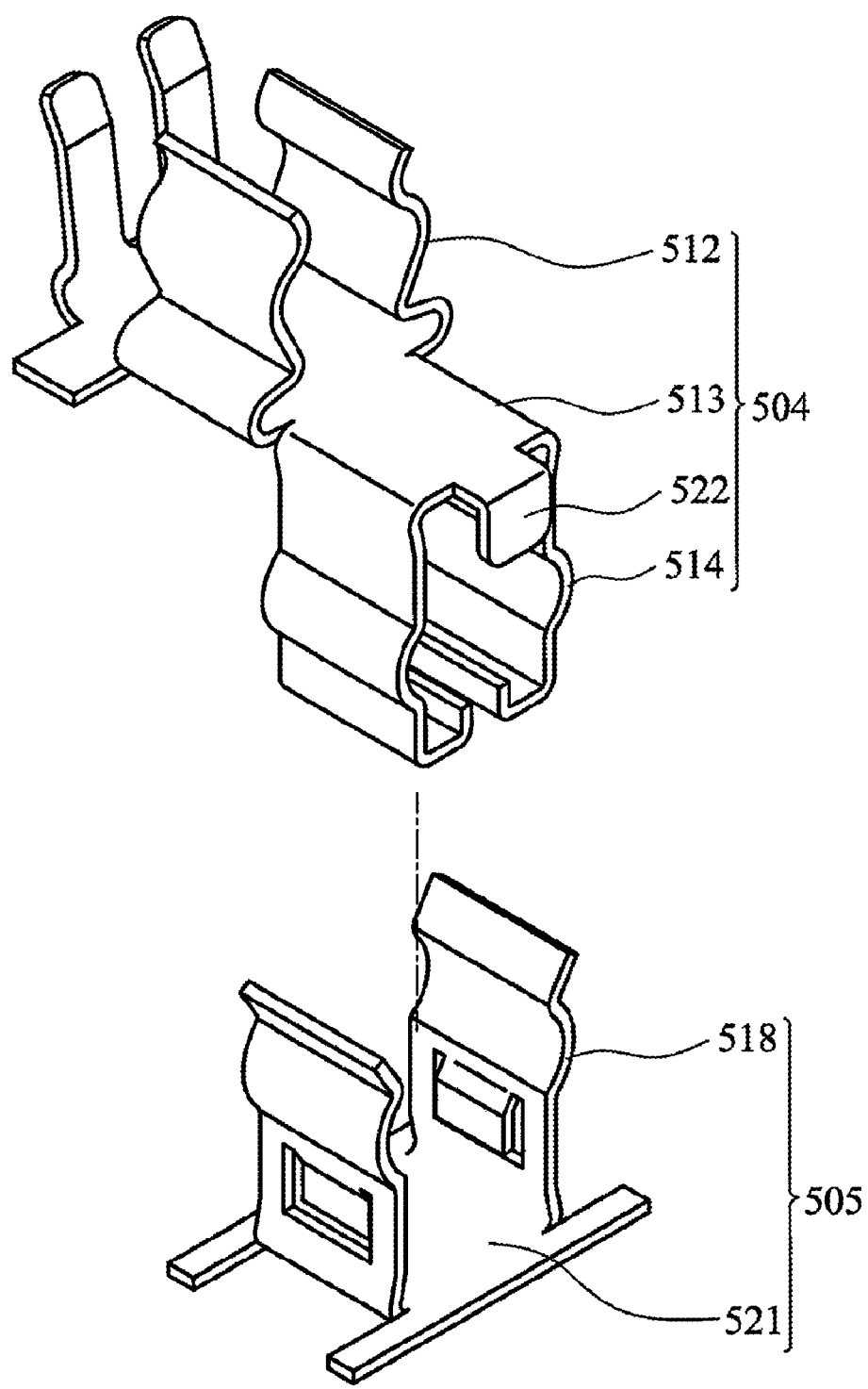
FIG. 14 is an exploded view of a first electrically conductive element and a second electrically conductive element of a third embodiment of the invention.
Figure 15:
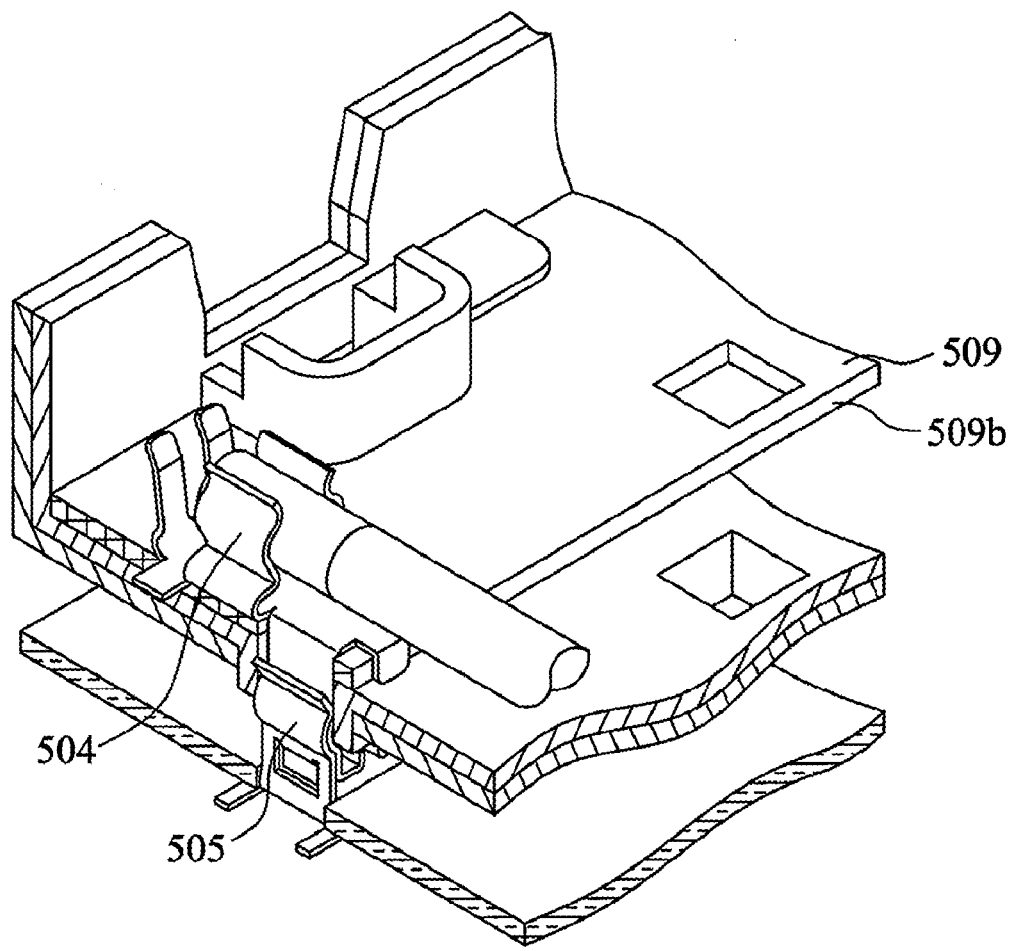
FIG. 15 is an assembly drawing of the backlight structure of the third embodiment of the invention.

Referring to FIG. 14, an exploded view of a first electrically conductive element 504 and a second electrically conductive element 505 of a third embodiment of the invention, and FIG. 15, an assembly drawing of the backlight structure of the third embodiment of the invention, the first electrically conductive element 504 has a first clipping part 512, a supporting part 513 and a first clipped part 514. The first clipping part 512 is located above the supporting part 513. The first clipped part 514 is located adjacent to the supporting part 513. The second electrically conductive element 505 has a second clipped part 518 extending upward from a bottom 521. In the third embodiment of the invention, the supporting part 513 has a fixing part 522. When the first clipping part 512 and the supporting part 513 of the first electrically conductive element 504 are exposed above the second circuit board 509, the fixing part 522 holds an edge 509b of the second circuit board 509 to increase the positioning effect of the first electrically conductive element 504. Other elements of the third embodiment are similar to those of the second embodiment, and the descriptions thereof are thus omitted.

Figure 16:
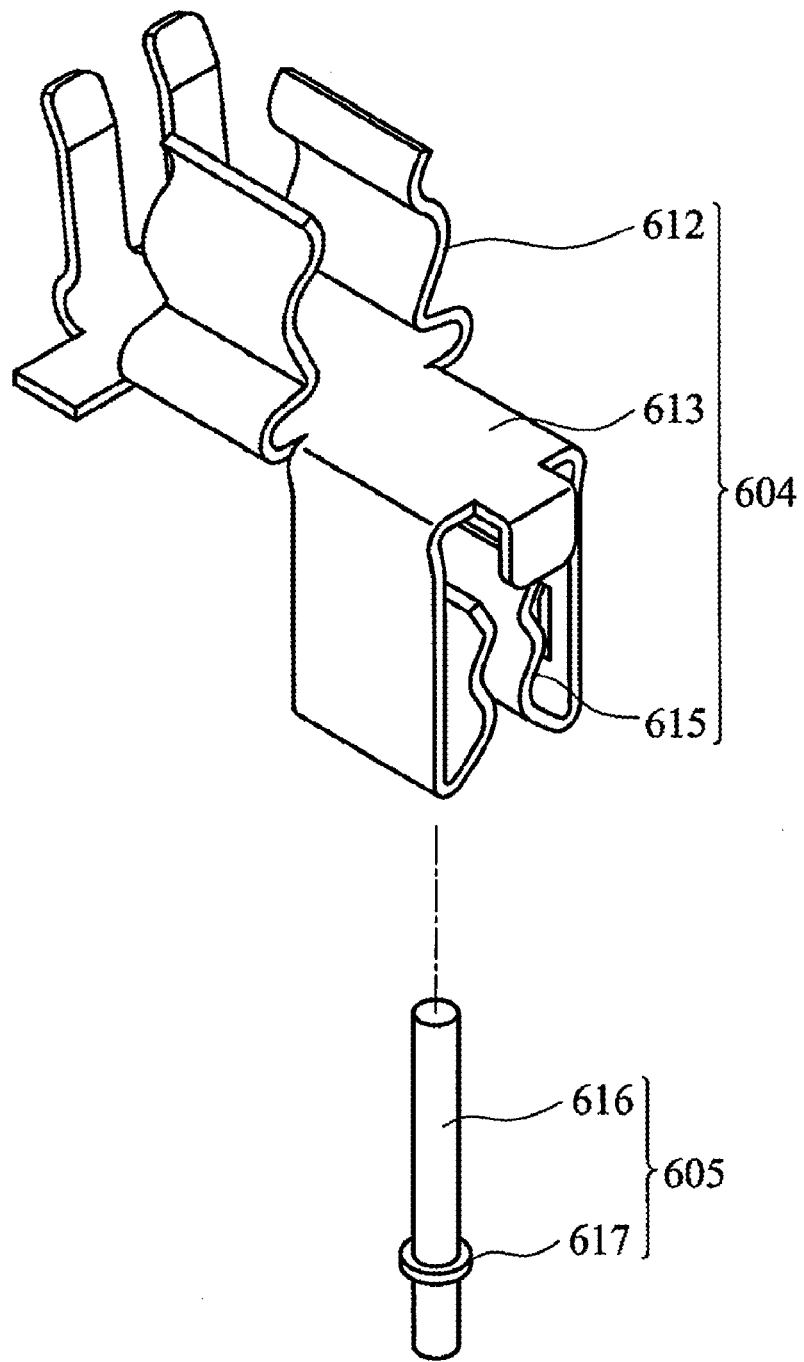
FIG. 16 is an exploded view of a first electrically conductive element and a second electrically conductive element of a fourth embodiment of the invention.

FIG. 16 is an exploded view of a first electrically conductive element 604 and a second electrically conductive element 605 of a fourth embodiment of the invention. The first electrically conductive element 604 has a first clipping part 612, a supporting part 613 and a third clipping part 615. In the fourth embodiment of the invention, the third clipping part 615 is located in the supporting part 613. The second electrically conductive element 605 has a second clipped part 616 and a backstay 617. The third clipping part 615 of the first electrically conductive element 604 clips the second clipped part 616 of the second electrically conductive element 605 to form an electrical connection therebetween when the first electrically conductive element 604 and the second electrically conductive element 605 are combined. Furthermore, the third clipping part 615 of the first electrically conductive element 604 is wavy, and the second clipped part 616 is cylindrical to increase the clipping capability of the first electrically conductive element 604. However, the third clipping part 615 of the first electrically conductive element 604 may be arched, and the second clipped part 616 may be bar-shaped. It is understood that the third clipping part 615 and the second clipped part 616 may be in any shape for achieving engagement and electrical connection therebetween. After finishing the assembly process, the backstay 617 is located below the second clipped part 616 and contacts a bottom of the first circuit board 603 (referring to other embodiments). Other elements of the fourth embodiment are similar to those of the second embodiment and third embodiment, and the descriptions thereof are thus omitted.

For the above description, the assembly, combining the connector and the electrically conductive element, is used to simplify the complicated assembly process of the conventional methods by replacing the welding technique of conventional methods with the electrical connections of the invention. Thus, the problems associated with disassembly, assembly, welding, labor and costs are improved, and the efficiency of the assembly and manufacturing process is raised.

While the invention has been described by way of example and in terms of preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A backlight structure comprising:
    a frame having a opening;
    a circuit board located below the frame and having at least a through hole, wherein the through hole aligns with the opening; and
    at least a connector passing through the opening and the through hole, protruding from a surface of the frame, and electrically connected to the circuit board,
    wherein the connector has an electrically conductive element located in the connector, protruding from a bottom of the connector and electrically connected to the circuit board, and at least a leg extending from the bottom of the connector and contacting the circuit board, wherein the connector further comprises a cavity receiving a tubular lamp, at least a gap disposed adjacent to the cavity, and a positioning wall disposed between the gap and the cavity, wherein the electrically conductive element has a clipping part located at a top of the electrically conductive element, contacting the positioning wall and clipping the tubular lamp, a backstay located at an end of the electrically conductive element and contacting the circuit board, and a through part located in the gap and connecting the clipping part and the backstay.

2. The backlight structure as claimed in claim 1, wherein the clipping part is substantially wavy or arched.

3. The backlight structure as claimed in claim 1, wherein the backstay is inclined to the leg at a right angle.

4. The backlight structure as claimed in claim 1, wherein the connector is plastic.

* * * * *